United States Patent [19]

Harada et al.

[11] Patent Number: 4,803,871
[45] Date of Patent: Feb. 14, 1989

[54] INSPECTION DEVICE FOR INSPECTING PROJECTIONS ON THE SURFACE OF PARTS

[75] Inventors: Osamu Harada, Atsugi; Akio Kojima, Hadano; Souhei Ikeda, Ayase; Yoshihisa Watanabe; Yoshihisa Tsuji, both of Hadano, all of Japan

[73] Assignees: Hitachi, Ltd, Tokyo; Hitachi Computer Engineering Co., Ltd, Kanagawa, both of Japan

[21] Appl. No.: 48,725

[22] Filed: May 11, 1987

[30] Foreign Application Priority Data

May 20, 1986 [JP] Japan .............................. 61-115189
Sep. 1, 1986 [JP] Japan .............................. 61-205528
Nov. 20, 1986 [JP] Japan .............................. 61-277108

[51] Int. Cl.⁴ .................. G01B 11/24; G01B 7/28; G01B 5/20; G01B 7/16
[52] U.S. Cl. ...................................... 73/104; 73/800; 73/865.8; 356/394; 356/376
[58] Field of Search ..................... 73/104, 800, 865.8; 356/376, 388, 394

[56] References Cited

U.S. PATENT DOCUMENTS

| | | | |
|---|---|---|---|
| 2,236,373 | 3/1941 | Kowalski | 73/104 X |
| 3,755,659 | 8/1973 | Bolhuis | 73/146 X |
| 3,862,047 | 1/1975 | Weltman et al. | 73/104 X |
| 3,879,993 | 4/1975 | Sorbie | 73/104 |
| 4,176,205 | 11/1979 | Moling | 73/104 X |
| 4,558,590 | 12/1985 | Desai et al. | 73/104 |

Primary Examiner—Tom Noland
Attorney, Agent, or Firm—Antonelli, Terry & Wands

[57] ABSTRACT

An inspection device for inspecting projections of a part which can be applied to a variety of parts having projections on the surface thereof such as leads of electronic parts having varying shapes. The inspection device includes a member having a two-dimensional surface to which projections of the part are two-dimensionally pressed at a predetermined pressure, and an arrangement for detecting a pressure distribution pattern on the surface of the member as well as a converter for converting the detected pattern to two-dimensional pattern information. Further, a memory is provided for storing a reference pattern of the projections of the part so that inspection may be effected by comparing the reference pattern with the converted two-dimensional pattern information.

17 Claims, 10 Drawing Sheets

INSPECTION DEVICE FOR INSPECTING PROJECTIONS ON THE SURFACE OF PARTS

BACKGROUND OF THE INVENTION

1. Field of the Invention

This invention relates to an inspection device for inspecting projections on the surface of parts. More particularly, the present invention relates to a lead inspection device suitable for inspecting the lead of surface mount type electronic parts.

2. Description of the Prior Art

A typical example of surface mount type electronic parts to be mounted to a printed circuit board is a so-called PLCC (Plastic Leaded Chip Carrier).

In this PLCC, leads extending from the side surfaces of a package are bent in J shape towards the bottom view side of the package. This PLCC is mounted to the printed circuit board with the bottom view side of the leads facing downward and the leads are soldered to pads of the printed circuit board.

The surface mount type electronic parts of the kind described above can increase more highly the mount density in comparison with so-called axial lead type electronic parts wherein the leads are inserted into through-holes of the printed circuit board. However, since the solder portion of each lead is hidden below the parts after soldering, it is difficult to look in parts failure.

Solder failure results mostly from the abnormal outward form of the lead caused by pushing up the lead or pushing down the lead, such as curve and float of the lead.

It is therefore important to inspect the normality of the lead before mounting the surface mount type parts such as a PLCC to the printed circuit board and to reject in advance the parts having abnormal leads in order to reduce the failure of soldering and to improve reliability.

FIG. 5 of the accompanying drawings is a schematic view of a conventional lead inspection device for inspecting the normality of the lead of surface mount type electronic parts such as a PLCC in which the leads are bent in the J shape.

In the conventional device, the part 1 to be inspected is fixed on a flat table 2 with the bottom view side of the lead facing upwards. The flat table 2 is then raised to a predetermined height by a cylinder 3 to locate the part 1 to a predetermined position of a light projector/receptor and to make inspection of the lead.

In this light projector/receptor system, the output light of the projector 28 is guided to the center portion of the bottom view side of the part 1 through a glass fiber 35, then emitted outside, received by glass fibers 36 that are disposed outside in such a manner as to corresponds to the leads of the part 1, respectively, and guided to the receptor 27 corresponding to the lead. Therefore, the quantity of incident light to the receptor 27 changes in accordance with the abnormal outward form of the leads such as float and/or curve.

The output signal of the receptor 27 is converted to a digital signal by an analog-to-digital convertor 29 and inputted to a decision unit 30. This decision unit 30 compares the value of the digital signal corresponding to each lead with the value of a digital signal corresponding to the same lead obtained from a good sample under the same condition in order to make decision of the lead of the part 1.

As an example of the prior art references relating to the inspection device of this kind, mention can be made of "MI-8500A PLCC Inspection System Catalog" of Machine Intelligence Company.

In accordance with the conventional device, however, the projector/receptor and good part samples must be changed whenever the surface shape of the parts such as the size and shape and the number of leads change, and cannot easily cope with many kinds of parts.

Moreover, the detection error is likely to occur because the conventional inspection system is based on the principle that the abnormal outward form of the lead such as the curve and/or float is judged by comparing the quantities of incident light into the projector corresponding to the individual lead.

SUMMARY OF THE INVENTION

It is therefore a main object of the present invention to provide an inspection device for inspecting projections on the surface of parts which can easily cope with various kinds ( models ) of parts.

The inspection device for inspecting projections on the surface of parts to accomplish the object described above comprises parts having projections on the surface thereof, a member having a surface to which the projections of the parts are pressed, means for pressing the projection of the parts to the surface of the member at a predetermined pressure, means for detecting a pressure difference on the surface of the member and means for converting the result of detection to two-dimensional pattern information.

DESCRIPTION OF THE PREFERRED EMBODIMENTS

First Embodiment

The first embodiment of the present invention relates to an inspection device for inspecting the outward form of lead of an electronic part by projecting the lead image using an optical plate. The device is of such a type which includes an optical plate for pushing an electronic part thereto and projecting the lead image of the electronic part, memory means storing in advance a reference lead image for each part type, and comparison/judgement means for comparing the lead image of the electronic part with the reference lead image and judging the outward form of the lead, and in which the silhouette image of each lead of the electronic part is projected when the electronic part is pushed against a translucent optical plate. This silhouette image is converted to a digitized image signal, for example. On the other hand, the reference lead image of an approved product for each part type is stored in advance in the memory means. The digitized image signal is read out from the memory means and compared with the digitized image signal of the electronic part in order to detect the abnormal outward form of the lead which is caused by pushing down or putting up the lead.

Hereinafter, the first embodiment of the invention will be described with reference to FIGS. 1 to 4.

Figure 1:
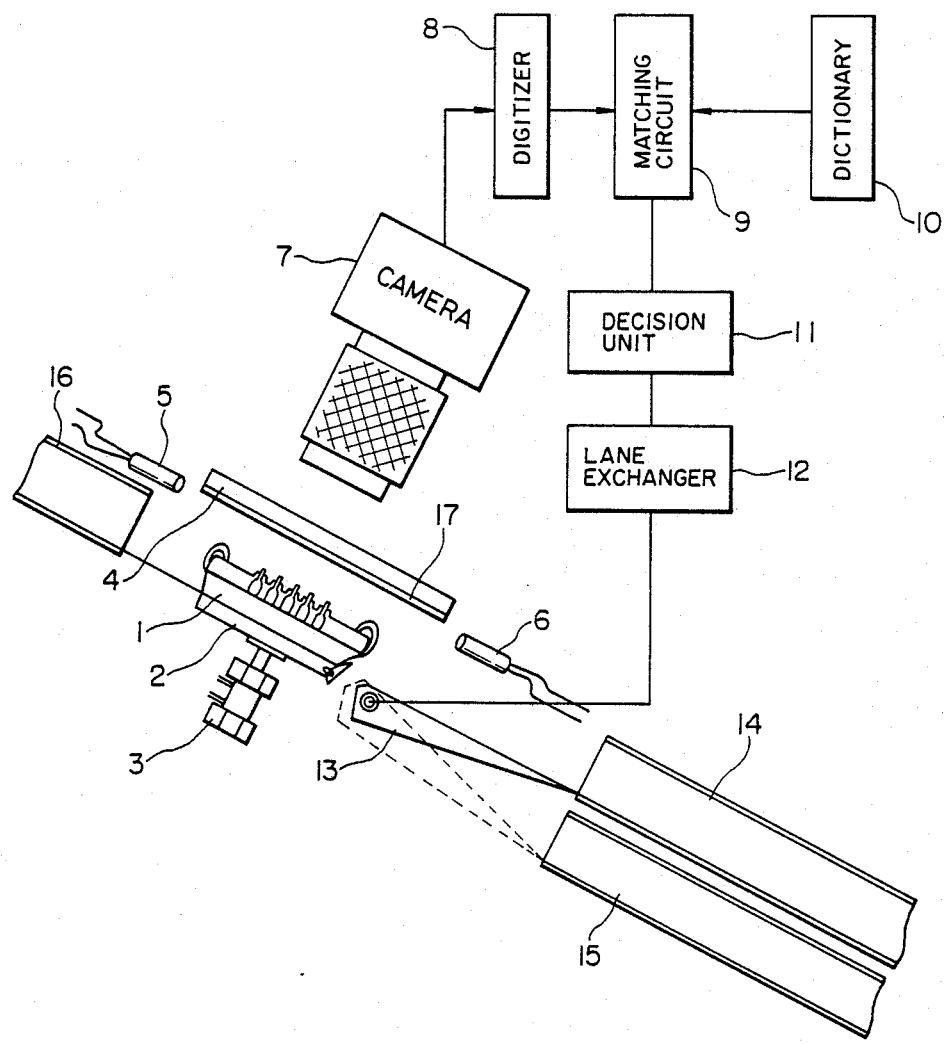
FIG. 1 is a side view of the first embodiment of the present invention.

In FIG. 1, parts to be inspected, such as a PLCC 1, are ejected from part ejection stick 16 and then gripped by a parts gripper 2. The gripper 2 is lifted up by a cylinder 3 and pushed against a plate 4 such as a glass plate 4 at a predetermined pressure.

Incidentally, the cylinder 3 can be replaced by a pulse motor or a servo motor.

The lower surface (or a contact surface with a parts lead) of the plate 4 is covered with a translucent film 17. Reference numerals 5 and 6 represent light projectors which project the rays of light from a transverse direction and form the silhouette image of the parts lead on the translucent film 17. The projector projects the rays of light uniformly from all directions of the parts lead.

Figure 2:
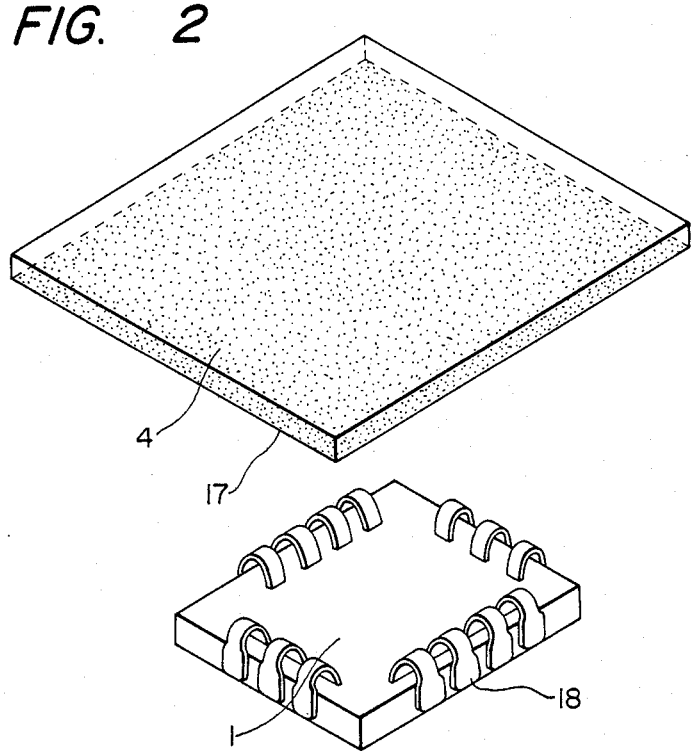
FIG. 2 is a perspective view showing the relationship between a parts and a plate among FIG. 1.

FIG. 2 shows the relationship between the plate 4 and the part 1. The leads 18 of the part 1 shown hereby are pushed inwardly and cause the abnormal outward form after soldering.

Figure 3:
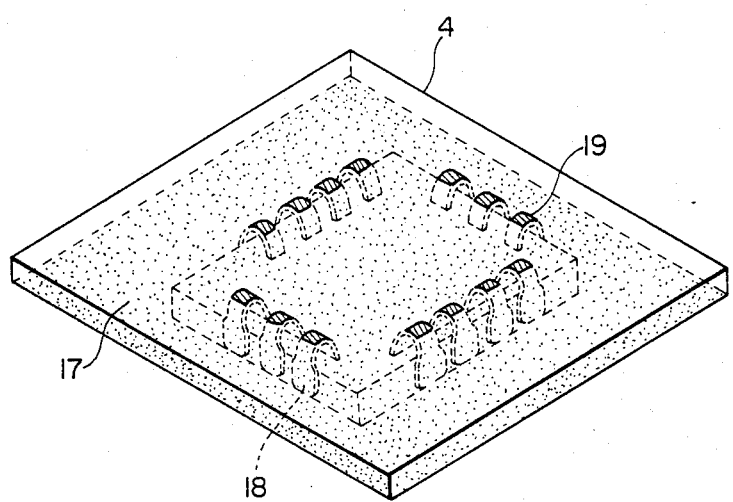
FIG. 3 is a perspective view when the parts and the plate are brought into mutual contact in FIG. 2.

FIG. 3 shows the silhouette images of the leads appearing on the translucent film 17 of the plate 4. This silhouette images 19 are received as the images by a camera 7, then converted to digitized images by a digitizer 8 and thereafter sent to a matching circuit 9. The matching circuit 9 receives in advance a dictionary (comparison pattern) 10 for each part shape and compares the dictionary with the digitized image in accordance with a later appearing comparison method, and makes judgment in accordance with the result of comparison. Then, a lane exchanger 12 operates a lane 13 and ejects the part either to a good parts ejection stick 14 or to a wrong parts ejection stick 15. Solder connection can be carried out highly reliably by use of only the good parts obtained in this manner.

Figure 4:
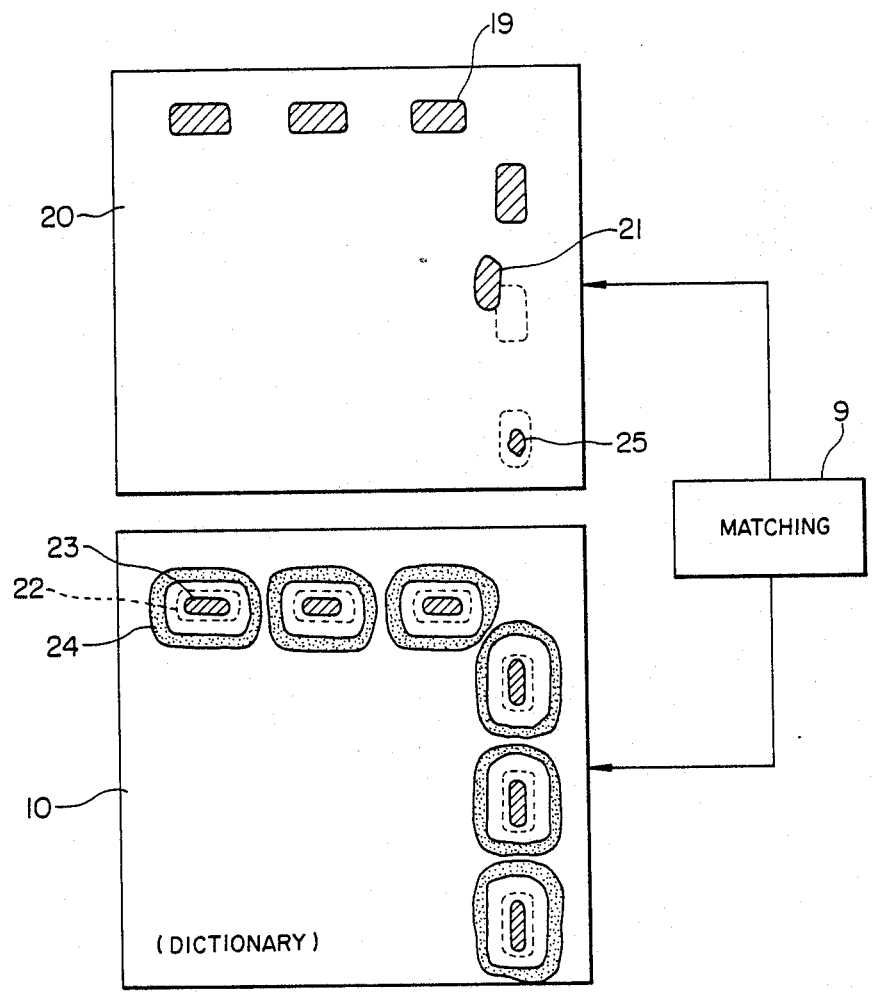
FIG. 4 is a plan view showing the relationship between the image of parts leads and a dictionary.
Figure 5:
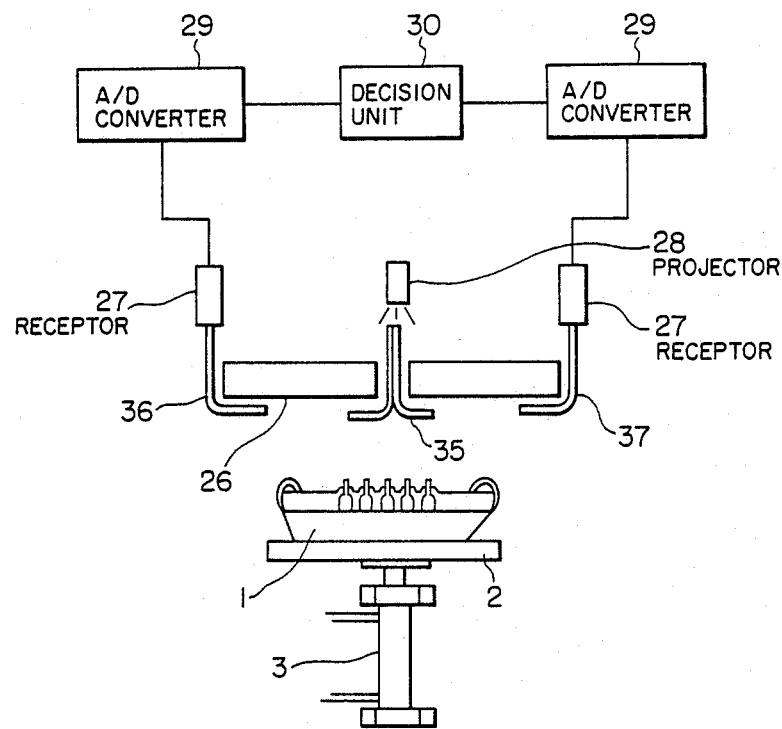
FIG. 5 is an explanatory view useful for explaining a method of detecting the outward from of leads of a part in accordance with the prior art technique.

A matching system between the digitized silhouette image of the part leads and the dictionary will be explained with reference to FIG. 4. Among the digitized silhouette images 20 of the part leads, reference numeral 19 represents the silhouette image of the good lead and 21 represent the silhouette image of the parts lead that exhibits the abnormal outward form. In the dictionary 10 corresponding to the silhouette image, dotted line 22 represents the region at which the normal lead is to be positioned. Therefore, a region 23 smaller than this region 22 is secured as a region where the parts lead within the range insuring the normal solder operation always exists. In other words, all these regions 23 must satisfy the condition that the leads exist in all these regions. A region 24 is secured outside the dotted line. The normal parts lead does not enter this region 24. Among the digitized silhouette images 20, the abnormal outward form of the leads 21 and 25 caused by pushing down or putting up the leads cannot satisfy the condition described above and are therefore judged as the wrong parts.

The standard for judgment will become severer when the regions 23 and 24 are closer to the dotted line 22 and will become more generous when these regions are away from the latter, on the contrary.

In this embodiment, the inspection standard for each part type is only the dictionary for pattern matching and can therefore cope easily with the change of the part type.

Since the standard for judgment can be set by the size of the pattern regions inside the dictionary, judgment can be made more accurately than the prior art technique which makes judgment by use of an analog quantity, that is, an optical quantity.

As described above, the first embodiment of the present invention utilizes the outward form of the lead of the electronic parts as the digitized silhouette image, for example, and then compares this image signal with the image signal for each part type that is in advance stored in the dictionary, in order to detect any outward form of the lead on the basis of the deviation of the region. Particularly because the image signal as the dictionary can be set electrically arbitrarily, it can cope easily with the change of the kind and shape of the electronic parts and can improve the detection accuracy.

Second Embodiment

The second embodiment of the present invention relates to an inspection device for inspecting electronic parts by a piezoelectric device surface. The inspection device consists of a detection head having a large number of piezoelectric devices arranged on a specific surface of the head, means for pushing the bottom view side of the lead against the specific surface of the detection head and means for detecting the lead failure of the electronic part on the basis of the output signals of a plurality of piezoelectric devices.

When the piezoelectric device attached side of the detection head and the bottom view inside of the lead of the electronic part are pushed against each other, each piezoelectric device outputs a signal proportional to the push force to the lead. Therefore, the lead failure such as the abnormal outward form of the lead caused by pushing down or putting up the lead can be detected on the basis of the output signal of each piezoelectric device.

Since the bottom view side of the lead of the electronic part is pushed against the piezoelectric device attached side of the detection head, it is not necessary to change the detection head even when the shapes of the electronic parts become different. Therefore, this inspection device can easily cope with many kinds of electronic parts having varying sizes.

Figure 7:
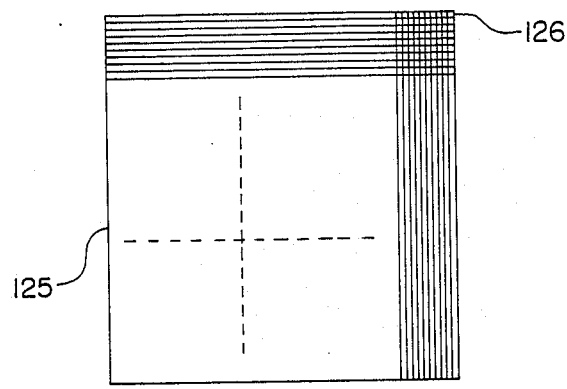
FIG. 7 is a schematic plan view showing, in a simplified form, the attached side of a piezoelectric element of a detection head.
Figure 8:
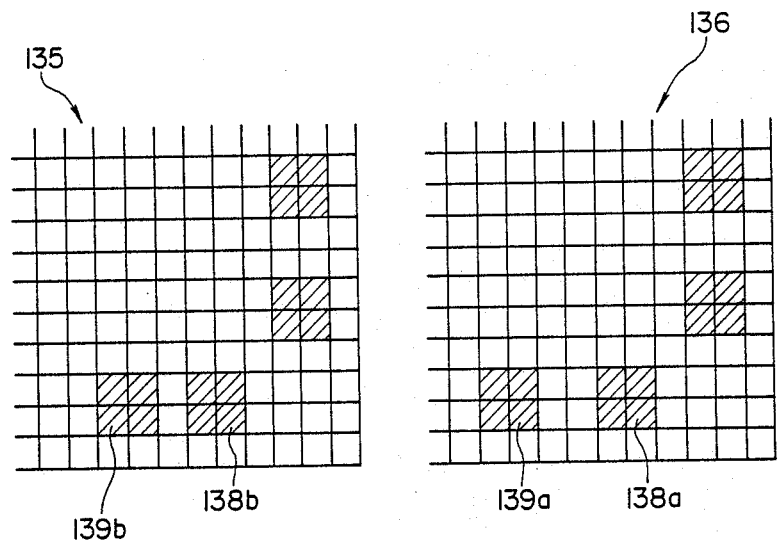
FIG. 8 is an explanatory view of image comparison.

The second embodiment of the invention will be described in further detail with reference to FIGS. 6 to 8.

Figure 6:
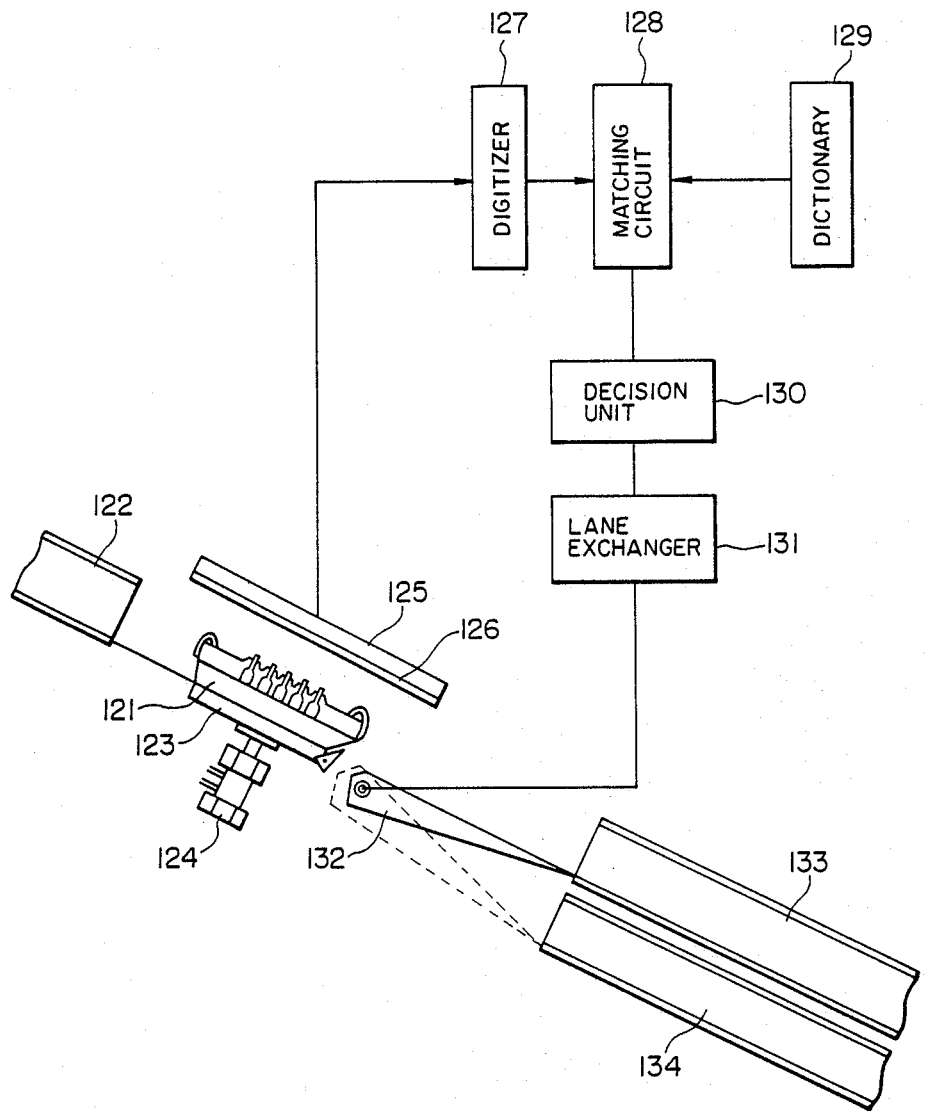
FIG. 6 is a schematic view showing the outline of the overall construction of a lead type inspection device in accordance with the second embodiment of the present invention.

FIG. 6 is a schematic view of the lead type inspection device of this embodiment. Reference numeral 121 represents a surface mount type electronic part to be inspected (such as a PLCC described already). This electronic part 121 is supplied to a parts gripper 123 from a parts ejection stick 122 and gripped with the bottom view side of the lead facing upward. This parts gripper 123 can grip and hold various electronic parts having varying shapes.

Reference numeral 124 represents a cylinder for moving up and down the parts gripper 123.

A detection head 125 is disposed in such a manner as to face the parts gripper 123. A large number of very small piezoelectric devices 126 are arranged in a lattice on the opposed surface of the detection head 125 to the parts gripper 123 as shown in FIG. 7. The output signal of each piezoelectric device 126 is outputted to the outside through a built-in amplifier (not shown) of the detection head 125.

Reference numeral 127 represents a digitizer, which digitizes the output signal of each piezoelectric device 126 sent thereto from the detection head 125 and inputs it to a matching circuit 128.

Reference numeral 129 represents a dictionary, in which digitized images corresponding to the kind of electronic parts are registered. The matching circuit 128 extracts the digitized images corresponding to the electronic part 121 from the dictionary 129, compares them with the plane digitized images which are inputted from the digitizer 127 and expressed by the digitized signals and outputs the result of comparison.

Reference numeral 130 represents a decision unit which judges the lead types of the electronic part 121 from the comparison information from the matching circuit 128.

Reference numeral 131 represents a lane exchanger which changes the direction of a lane 132 in accordance with the judgment output of the decision unit 130. The lane 132 distributes the electronic part 121 into good parts ejection stick 133 and wrong parts ejection stick 134 after inspection of the lead type inspection.

Next, the lead type inspection operation will be described.

When the parts gripper 123 grips the electronic part 121, the cylinder 124 operates and pushes up the parts gripper 123 and both sides of the electronic part 121 is pushed against the piezoelectric device attached side of the detection head 125 at a predetermined pressure. The detection head 125 outputs the output signal proportional to the push force to each piezoelectric device 126 and after this output signal is digitized by the digitizer 127, it is inputted to the matching circuit 128.

The matching circuit 128 compares the plane digitized image expressed by the digitized signal and the plane digitized image that is extracted from the dictionary 129 and corresponds to the electronic part 121. This comparison will be described with reference to FIG. 8.

In this drawing, reference numeral 135 represents an example of the plane digitized image expressed by the digitized signal of the output signal of the piezoelectric device, and reference numeral 136 represents an example of the plane digitized image as the reference.

Reference numerals 139a and 139b represent regions where certain leads should exist, and reference numerals 138a and 139a represent the regions where the corresponding leads of the electronic parts under inspection exist in practice. As is apparent from the drawing, the positions of the regions 139a and 139b deviate from one another. This means that the lead is curved.

If the abnormal outward form or floating quantity of a certain lead exceeds a limit, the leads nearby are sometimes not pushed against the piezoelectric devices 126 or its push force is not sufficient. In such a case, part of the lead region does not appear on the plane digitized image 135 or the shape of the region gets distorted.

The matching circuit 128 applies the deviation quantity of such a lead region, fall-off and distortion of part of the lead region, and the like, as the comparison information to the decision unit 130.

When the deviation quantity (curving quantity) of such a lead region or its distortion exceeds the allowable limit, or when fall-off of the lead region exists, the decision unit 130 judges the lead as having inferior lead type.

When the lead is judged as having the lead type failure by the decision unit 130, the lane switching portion 131 switches the lane 132 to the wrong parts ejection stick 134 and when the lead is judged as the good lead, it switches the lane 132 to the good parts ejection stick 133.

The cylinder 134 operates in the reverse direction and lowers the parts gripper 123 down to the position shown in FIG. 6.

After the switching operation of the lane 132 is complete, gripping of the part by the parts gripper 123 is released and the electronic part 121 is ejected to the good parts ejection stick 133 or the wrong parts ejection stick 134 through the lane 132.

In this manner the lead type inspection of one electronic part is complete.

Though the second embodiment has thus been given, the present invention is not particularly limited thereto.

For example, the arrangement form, size and number of the piezoelectric devices can be changed suitably in accordance with the lead arrangement, lead size and inspection accuracy (resolution) of the electronic parts to be inspected. Generally, the inspection accuracy drops when the number of piezoelectric devices is decreased or when their size is increased, but the inspection speed can be improved because the image comparison processing time for the same processor can be reduced.

Other means such as a pulse motor, a servo motor, and the like, can be used in place of the cylinder described above.

The parts gripper may be of such a type that physically holds the electronic part or holds the part by vacuum absorption or the like.

Though the second embodiment detects the parts type failure by comparing the plane digitized image expressed by the digitized signal of the output signal of the piezoelectric device with the plane digitized image as the reference, the lead type failure can be directly judged from the output signal of the piezoelectric device by level judgment of the output signals of the individual piezoelectric devices in the same way as in the prior art technique.

However, the system which compares the images as in the second embodiment can improve reliability and accuracy of judgment in comparison with the conventional system which directly utilizes the analog quantity related with the individual leads for the judgment of the lead type failure. It provides another advantage that if the plane digitized image as the reference is prepared for each kind of electronic part, the inspection device can cope with the change of kinds of electronic components.

Though the detection head is kept fixed and the part is moved in the embodiment described above, this relationship may be reversed.

Various changes or modifications can be further made without departing from the gist and spirit of the present invention.

Furthermore, the present invention can naturally be applied to the lead type inspection of surface mount type electronic parts other than a PLCC.

As is apparent from the description given above, the second embodiment of the present invention pushes the piezoelectric device attached side of the detection head to the bottom view side of the lead of the parts and detects the abnormal outward form of the lead on the basis of the output signal of each piezoelectric device. Therefore, it is not necessary to change the detection head even when the shapes of the parts become different. In other words, the inspection device of this embodiment can easily cope with many kinds of electronic parts having varying shapes and sizes.

Third Embodiment

The third embodiment of the present invention relates to an inspection device which detects the leads of electronic parts from a piezoelectric device surface and displays the detection result as an image by a liquid crystal device.

The inspection device of this embodiment consists of a piezoelectric device, means for pushing the bottom view side of the lead of the electronic part to the surface of the piezoelectric device, a liquid crystal device which is bonded to, or disposed in the proximity of, the piezoelectric device and displays the silhouette image of the lead of the parts pressed to the surface of the piezoelectric device in response to the charge developing in the piezoelectric device, imaging means for photographing the silhouette image displayed on the liquid crystal device, means for storing the reference lead image of the part and means for judging the lead of the part by comparing the reference lead image and the silhouette image picked up by the imaging means.

Charge develops on both surface of each piezoelectric device in proportion to the pressure applied. When the bottom view side of the lead of the part is pushed to the surface of the piezoelectric device, charge due to dielectric polarization occurs at the contact portion of the piezoelectric device with each lead.

The arrangement of molecules changes at the portion of the liquid crystal where the charge occurs, due to the charge so that its optical characteristics change and only that portion becomes transparent, for example. In this manner the silhouette image of the lead which comes into contact with the surface of the piezoelectric device is displayed by the liquid crystal device.

If the lead type of the electronic part is normal, its silhouette should be at the original position on the silhouette image. If the lead is curved, the silhouette of the lead will deviate from the original position. If the lead floats and does not come into contact with the surface of the piezoelectric device or if the contact pressure is not sufficient even when the lead is in contact with the surface of the piezoelectric device, the silhouette of the lead will not appear or even if it does, its part will be missing partially.

Therefore, the abnormal form such as the curve and float of the lead of the electronic part can be detected by comparing the reference lead image corresponding to the lead type of the part with the silhouette image displayed on the liquid crystal device and picked up by the imaging means.

Since the bottom view side of the lead of the parts can be pressed to the surface of the piezoelectric device irrespective of the shape and the number of leads of the part and since the silhouette image of the similar leads can be displayed on the liquid crystal device, the inspection device can easily cope with various kinds of parts by merely preparing the reference lead image for each kind of part.

Hereinafter, the third embodiment of the present invention will be described in further detail with reference to FIGS. 9 through 13.

Figure 9:
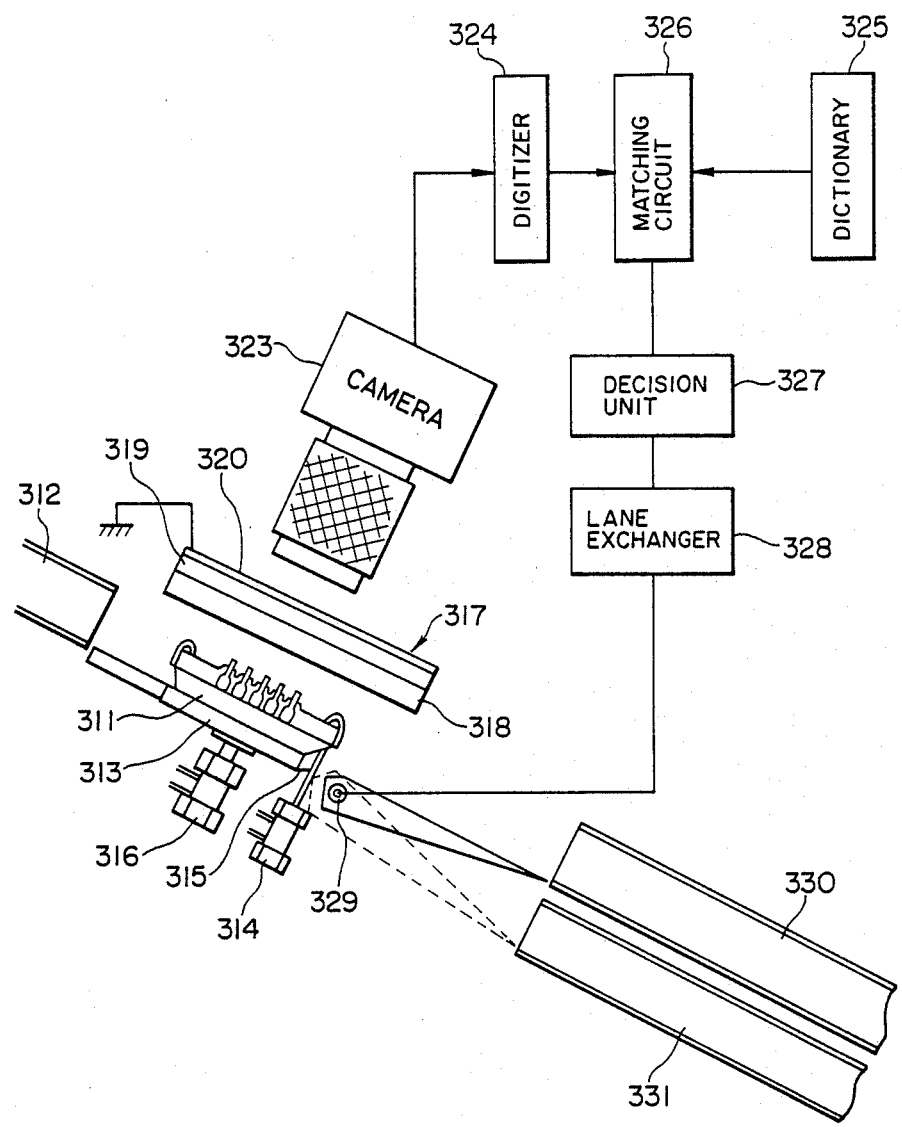
FIG. 9 is a schematic view showing, in a simplified form, the overall construction of the lead type inspection device in accordance with still another embodiment of the present invention.

FIG. 9 is a schematic view of the lead type inspection device of this embodiment. Reference numeral 311 represents a surface mount type electronic part to be inspected. This embodiment will deal with PLCC as the parts 311 by way of example.

The parts 311 is supplied from a parts ejection stick 312 to a parts gripper 313 for inspection, held and located by a stopper 315 actuated by a cylinder 314 and held by the parts gripper 313 with the bottom view side of the lead facing upward as shown in the drawing. The parts gripper 313 can hold parts having varying shapes. Reference numeral 316 represents a cylinder for moving up and down the parts gripper 313. A detection head 317 is disposed in such a manner as to oppose the parts gripper 313.

Figure 10:
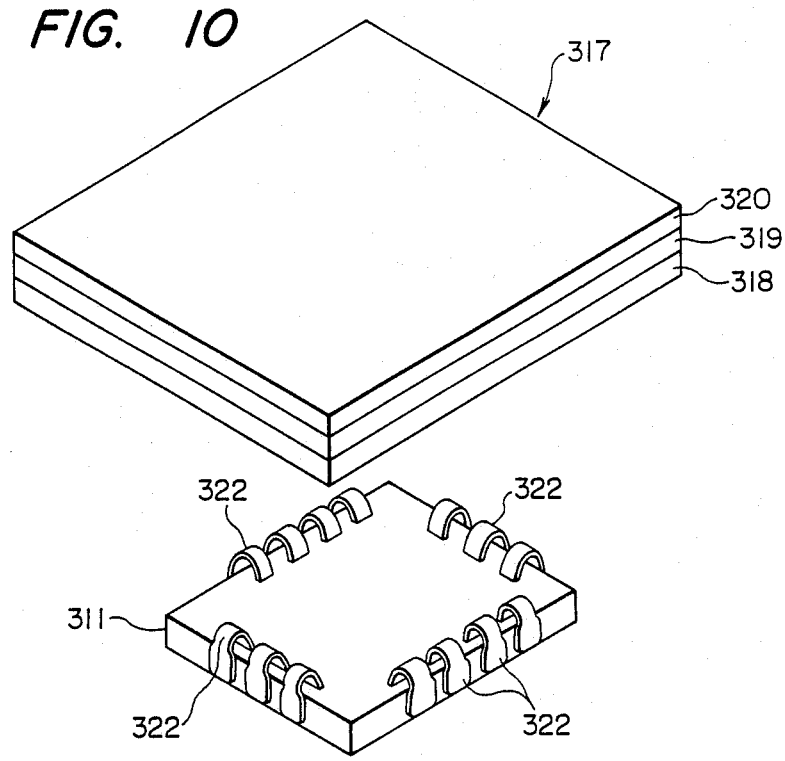
FIG. 10 is an enlarged perspective view of a detection head and an electronic part.

FIG. 10 is an enlarged perspective view of the detection head 317 and the parts 311. As shown in this drawing, the detection head 317 is produced by directly bonding a plate-like piezoelectric device 318 to a liquid crystal device 319 and depositing a conductive transparent film 320 as the electrode onto the surface of the liquid crystal device 319. This conductive transparent film 320 is grounded. Leads 322 are extended from the side surface of the package, bent towards the bottom view side of the leads (towards the upper surface of the package in the drawing) and molded in J-shape. The part 311 is held by the parts gripper 313 with the bottom view side of the lead facing upward.

Turning back again to FIG. 9, reference numeral 323 represents a television camera for photographing the silhouette image of the leads appearing on the surface of the liquid crystal device 319. Reference numeral 324 represents a digitizer for digitizing the picture signal inputted from the television camera 323, and reference numeral 325 represents a dictionary storing therein a reference lead image (whose detail will be described elsewhere) prepared in advance in accordance with the kind of the part.

Reference numeral 326 represents a matching circuit for comparing the digitized lead silhouette image inputted from the digitizer 324 with the reference lead image read out from the dictionary 325. Reference numeral 327 represents a decision unit for judging the lead type of the parts 311 in accordance with the result of comparison by the matching circuit 326. Incidentally, this decision unit 327 may be contained in the matching circuit 326. Reference numeral 328 represents a lane switching portion for switching the direction of a lane 329 in accordance with the result of judgment by the decision unit 327. The lane 329 distributes the part 311 after lead type inspection to a good parts stick 330 or a wrong parts stick 331.

Next, the operation of the lead type inspection device will be explained. When the part 311 of the parts gripper 313 is held and located, the cylinder 316 operates and pushes up the parts gripper 313 and the bottom view side of the lead of the part 311 is pressed to the surface of the piezoelectric device 318 of the detection head 317 at a predetermined pressure.

Figure 11:
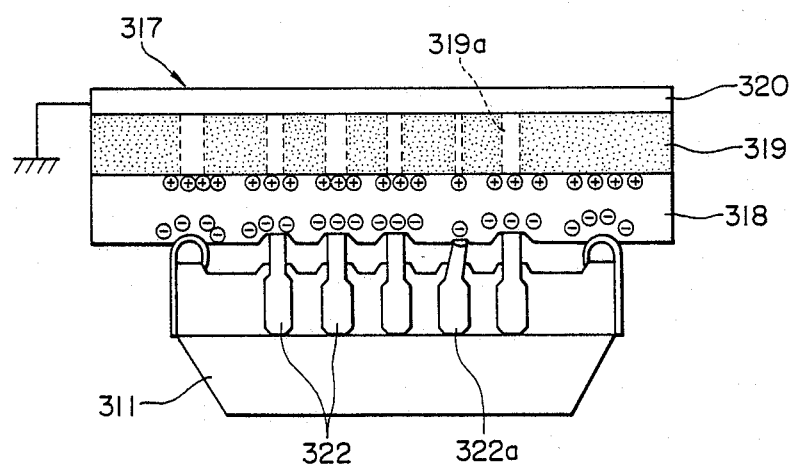
FIG. 11 is an explanatory view useful for explaining the electrical behaviour of a piezoelectric device and a liquid crystal device.

FIG. 11 is an explanatory view of the electrical behaviour of the piezoelectric device 318 and the liquid crystal device 319 when the lead is pressed.

As shown in FIG. 11, the piezoelectric device 318 causes dielectric polarization at the portion at which the lead 322 is pressed, and positive and negative (+and −) charges occur across both ends of this portion. This charge quantity is substantially proportional to the press force. When compared with the portion to which the normal type lead 322 is pressed, the portion to which the lead 322a which is curved or floats up, for example, exhibits a smaller charge quantity or does not at all cause the charge.

On the other hand, one of the surfaces of the liquid crystal device 319 is in contact with the piezoelectric device 318 while the other is in contact with the conductive transparent film 320 which is grounded. Therefore, an electric field occurs inside the liquid crystal device 319 due to the charge that occurs due to dielectric polarization of the piezoelectric device 318. This electric field changes the arrangement of molecules inside the liquid crystal device 319 and its optical characteristics change in accordance with the electric field. Under the state where no electric field occurs, for example, the liquid crystal device 319 remains whitened (translucent) but only at the portion 319a of the liquid crystal device where the electric field occurs, it becomes transparent. However, the liquid crystal exhibiting the opposite change may be used.

Figure 12:
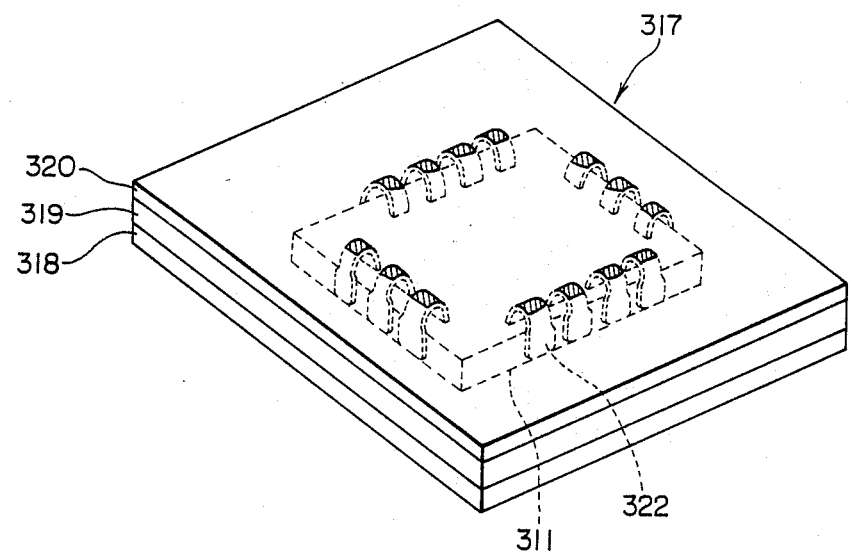
FIG. 12 is a perspective view showing the silhouette image of the lead displayed by the liquid crystal device in association with the electronic parts.

As shown in the perspective view of FIG. 12, the silhouette image of the lead 322 which is in contact with the surface of the piezoelectric device 318 is displayed by the liquid crystal device 319 and photographed by the television camera 323 through the conductive transparent film 320. The silhouette image of the lead thus picked up is converted to a digitized image by the digitizer 324 and inputted to the matching circuit 326, where it is compared with the reference lead image.

Figure 13:
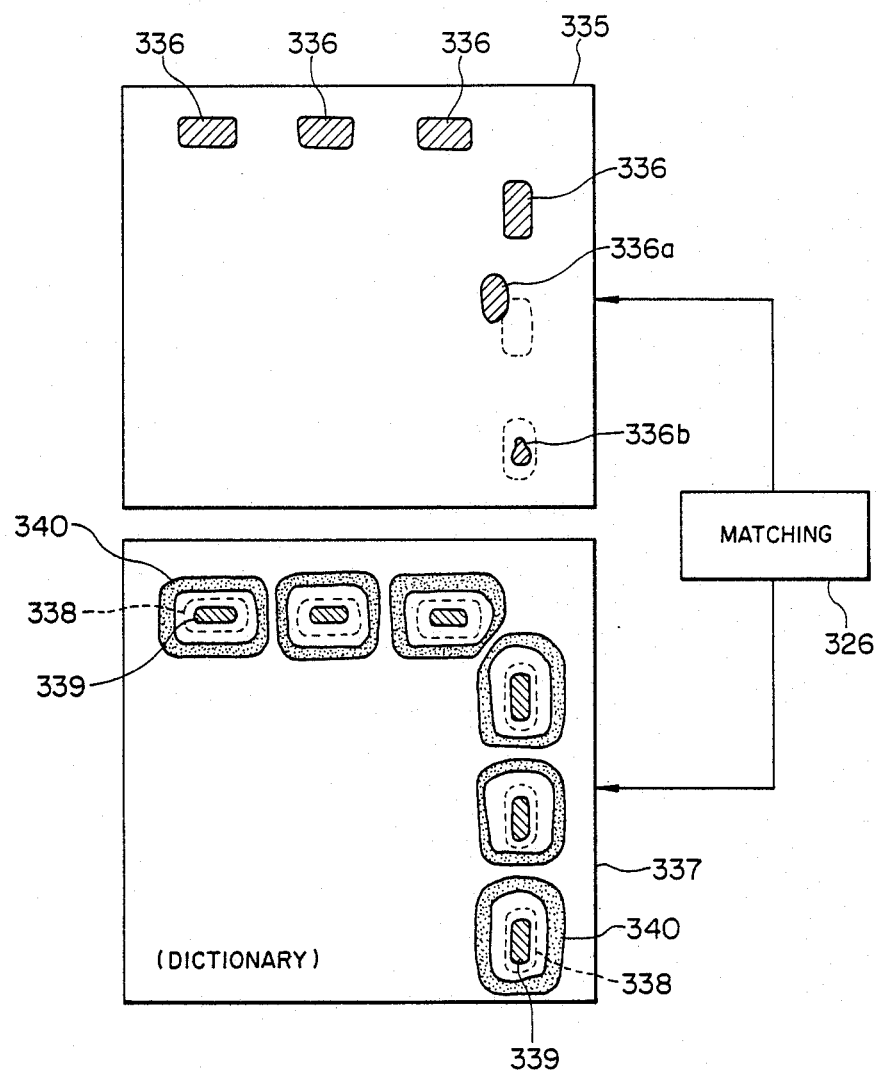
FIG. 13 is an explanatory view useful for comparison of the silhouette image of the lead and a reference lead image.

FIG. 13 is an explanatory view of comparison. In the drawing, reference numeral 335 represents the silhouette image of the lead of the part 311 and 336 represents the silhouette of the portion of each lead which comes into contact with the surface of the piezoelectric device 318. Among these silhouettes, reference numeral 336a represents the silhouette of a curved lead, which deviates from its original position (from the position represented by dash line). Reference numeral 336b represents the silhouette of a floating lead. Since its contact with the piezoelectric device 318 is not sufficient, the overall area of the silhouette is remarkably smaller than that of the silhouette of the normal lead.

Reference numeral 337 represents a reference lead image. In this image, reference numeral 338 represents the region at which the silhouette of the normal lead should exist. A region 339 inside this region 338 is a region where the leads within the range which insures normal solder operation should exist A ring-like region 340 outside the region 338 is a region where the normal lead should not originally exist.

The matching circuit 326 compares the relation of position between the silhouette of each lead on the silhouette image 335 and each region 338, 339, 340 of the reference lead image 337. In this case, the silhouette 336 of the normal lead satisfies the condition "Lead exists" in the corresponding region 339. However, as to the silhouette 336a of the curved lead, the condition "Lead does not exist" in the corresponding region 340 is not satisfied and the condition "Lead exists" throughout the corresponding region 340 is not satisfied, either. As to the silhouette 336b of the floating lead, the silhoutte exists only at the part of the corresponding region 339 and the condition "Lead exists" throughout the region is not satisfied.

The decision unit 327 makes judgment of the parts on the basis of the result of comparison. If the leads do not satisfy the conditions of the silhouettes 336a, 336b, the part 311 is judged as the wrong part. The parts satisfying all the conditions are judged as the good parts.

Since judgment of the part is made by comparing each region of the reference lead image with the silhouette of the image of each lead of the silhouette image which is photographed, judgment can be made more accurately than the conventional system which makes judgment by use of an analog quantity such as an optical quantity.

When the regions 339 and 340 of the reference lead image 337 is brought closer to the region 338, the judgment standard becomes severer and when the former is away from the latter, the judgment standard becomes more generous. In this manner the judgment standard can be changed easily.

When the part 311 is judged as the good part in the manner described above, the lane 329 is switched to the good parts ejection stick 330 by the lane switching portion 328 and when the parts is judged as the wrong parts, the lane 329 is switched to the wrong parts ejection stick 331. The cylinder 316 operates in the reverse direction and lowers the parts gripper 313 down to the position shown in FIG. 9. Then, the parts gripper 313 releases the part and the cylinder 314 lowers the stopper 315. Therefore, the part 311 is ejected to the good or wrong parts ejection stick 330 or 331 through the lane 329, thereby completing the lead shape inspection of one electronic part.

Though the third embodiment of the present invention has thus been described, the present invention is not particularly limited thereto.

For example, the piezoelectric device and liquid crystal device of the detection head need not be of an integral plate type, but may be divided into a plurality of units. The piezoelectric device and the liquid crystal device may be indirectly superposed under the condition that the display function described above is not lost.

Other driving means such as a pulse motor, a pulse motor, or the like, may be used in place of the cylinder for driving the parts gripper and the stopper.

The parts gripper may be of a type that physically grips the parts or holds the parts by vacuum absorption or the like.

Though the detection head is kept fixed and the electronic parts is moved in the third embodiment, the relationship may be reversed.

Furthermore, the type of the reference lead image may be changed suitably.

Various other changes and modifications of the present invention can be made.

The present invention can of course be applied to the lead type inspection of electronic parts other than a PLCC.

As is obvious from the description given above, the present invention presses the bottom view side of the lead of the electronic part to the surface of the piezoelectric device, displays the silhouette image of the lead coming into contact with the surface of the piezoelectric device by the liquid crystal device, and judges the abnormal form of the lead such as curve and float by comparing the photographed image with the reference image. Therefore, the inspection device of the invention can easily cope with a variety of parts having different shapes and different number of leads by merely changing the reference lead image.

What is claimed is:

1. An inspection device for inspecting projections on the surface of a part, comprising:
    a part having projections on the surface thereof;
    a member having a two-dimensional surface to which said projections of said part are pressed;
    means for two-dimensionally pressing said projections of said part to said surface of said member at a predetermined pressure;
    means for detecting a pressure distribution pattern of said projections on said two-dimensional surface of said member; and
    means for converting said pressure distribution pattern to electronic pattern information.

2. An inspection device for inspecting projections on the surface of a part according to claim I, further comprising:
    means for storing a reference pattern of said projections of said part with respect to said pattern information; and
    means for inspecting said projections by comparing said reference pattern with said pattern information.

3. An inspection device for inspecting projections on the surface of a part according to claim 1, wherein said projections of said part are leads of an electronic part.

4. An inspection device for inspecting projections on the surface of part according to claim 1, wherein said surface of said member is a plane surface.

5. An inspection device for inspecting projections on the surface of a part according to claim 1, wherein said member is an optical plate having a plane to which said projections of said part are pressed, and said detecting means includes a light source for detecting said pressure distribution.

6. An inspection device for inspecting projections on the surface of a part according to claim 1, wherein said member is a detection member produced by arranging a large number of piezoelectric devices on the surface thereof.

7. An inspection device for inspecting projections on the surface of a part according claim 1, wherein said member consists of piezoelectric devices arranged on the surface of said member and a liquid crystal device converting the charge developing in said piezoelectric devices to an image pattern.

8. An inspection device for inspecting projections on the surface of a part according to claim 1, wherein said member consists of piezoelectric devices arranged on the surface of said member and a liquid crystal device converting the charge developing in said piezoelectric devices to an image pattern, and said inspection device further includes means for photographing said image pattern.

9. An inspection device for inspection projections on the surface of a part according to claim 1, wherein said means for pressing provides a static pressing of said projections of said part to said surface of said member.

10. An inspection device for inspecting projections on the surface of a part according to claim 9, wherein said member consists of piezoelectric devices arranged on the surface of said member and a liquid crystal device converting the charge developing in said piezoelectric devices to an image pattern, and means for photographing said image pattern.

11. An inspection device for inspecting projections on the surface of a part, comprising:
    a part having projections on the surface thereof;
    a member having a surface to which said projections of said part are pressed;
    means for pressing said projections of said part to said surface of said member at a predetermined pressure;
    means for detecting pressure on said surface of said member;
    means for converting the result of said detection to two-dimensional pattern information;
    means for storing a reference pattern of said projections of said part with respect to said two-dimensional pattern information; and
    means for inspecting said projections by comparing said reference pattern with said converted two-dimensional pattern information.

12. An inspection device for inspecting projections on the surface of a part according to claim 11, wherein said projections of said part are leads of an electronic part.

13. An inspection device for inspecting projections on the surface of a part according to claim 11, wherein said surface of said member is a plane surface.

14. An inspection device for inspecting projections on the surface of a part according to claim 11, wherein said member is an optical plate having a plane to which said projections of said part are pressed, and said pressure detecting means includes a light source for detecting said pressure.

15. An inspection device for inspecting projections on the surface of a part according to claim 11, wherein said member is a detection member produced by arranged a large number of peizoelectric devices on the surface thereof.

16. An inspection device for inspecting projections on the surface of a part according to claim 11, wherein said member consists of piezoelectric devices arranged on the surface of said member and a liquid crystal device converting the charge developing in said piezoelectricl devices to an image pattern.

17. An inspection device for inspecting projections on the surface of a part, comprising:
    a part having projections on the surface thereof;
    an optical plate having a plane to which said projections of said part are pressed;
    means for pressing said projections of said part to said plane of said optical plate at a predetermined pressure;
    means including a light source means for detecting a pressure pattern on said plane of said optical plate; and
    means for converting the result of said projection to two-dimensional pattern information.

* * * * *